(12) United States Patent
Wuister et al.

(10) Patent No.: US 8,889,055 B2
(45) Date of Patent: Nov. 18, 2014

(54) IMPRINT LITHOGRAPHY METHOD

(75) Inventors: Sander Frederik Wuister, Eindhoven (NL); Arie Jeffrey Den Boef, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 294 days.

(21) Appl. No.: 12/886,451

(22) Filed: Sep. 20, 2010

(65) Prior Publication Data

US 2011/0068510 A1   Mar. 24, 2011

Related U.S. Application Data

(60) Provisional application No. 61/244,746, filed on Sep. 22, 2009.

(51) Int. Cl.
| | | |
|---|---|---|
| *B29C 35/08* | (2006.01) | |
| *G03F 7/00* | (2006.01) | |
| *B82Y 40/00* | (2011.01) | |
| *B82Y 10/00* | (2011.01) | |

(52) U.S. Cl.
CPC ............. *G03F 7/0002* (2013.01); *B82Y 40/00* (2013.01); *B82Y 10/00* (2013.01)
USPC .......................................... 264/496; 264/319

(58) Field of Classification Search
USPC .......................................... 264/319, 494, 496
See application file for complete search history.

(56) References Cited

U.S. PATENT DOCUMENTS

| | | | |
|---|---|---|---|
| 6,334,960 B1 | 1/2002 | Willson et al. | |
| 2002/0115002 A1* | 8/2002 | Bailey et al. | 430/5 |
| 2004/0004300 A1 | 1/2004 | Yamaguchi et al. | |
| 2004/0089979 A1* | 5/2004 | Rubin | 264/293 |
| 2004/0124566 A1 | 7/2004 | Sreenivasan et al. | |
| 2005/0037143 A1* | 2/2005 | Chou et al. | 427/248.1 |
| 2006/0268256 A1 | 11/2006 | Kolesnychenko et al. | |
| 2007/0018360 A1* | 1/2007 | Kolesnychenko et al. | 264/407 |
| 2008/0012185 A1* | 1/2008 | Iida et al. | 264/496 |
| 2008/0067424 A1* | 3/2008 | Botma et al. | 250/492.2 |
| 2008/0226990 A1* | 9/2008 | Hintersteiner | 430/5 |
| 2010/0090130 A1 | 4/2010 | Ganapathisubramanian et al. | |
| 2010/0104682 A1 | 4/2010 | Ando et al. | |

FOREIGN PATENT DOCUMENTS

| | | |
|---|---|---|
| JP | 07-235474 | 9/1995 |
| JP | 2004-39136 | 2/2004 |
| JP | 2005-062634 | 3/2005 |
| JP | 2006-332678 | 12/2006 |
| JP | 2008010834 A * | 1/2008 |
| JP | 2009-181617 | 8/2009 |
| WO | 02/067055 | 8/2002 |

OTHER PUBLICATIONS

Korean Office Action dated Mar. 29, 2012 in corresponding Korean Patent Application No. 10-2010-0091404.

(Continued)

*Primary Examiner* — Leo B Tentoni
(74) *Attorney, Agent, or Firm* — Pillsbury Winthrop Shaw Pittman LLP

(57) ABSTRACT

An imprint lithography method is disclosed that includes bringing an imprint template into contact with imprintable medium provided on a substrate, and directing actinic radiation at the imprintable medium, the actinic radiation being oriented such that it is not perpendicularly incident upon a patterned surface of the imprint template.

20 Claims, 5 Drawing Sheets

(56) References Cited

OTHER PUBLICATIONS

Japanese Office Action mailed Apr. 25, 2012 in corresponding Japanese Patent Application No. 2010-206182.
Korean Office Action dated Aug. 29, 2011 in corresponding Korean Patent Application No. 10-2010-0091404.
J. Haisma, "Mold-Assisted Nanolithography: A Process for Reliable Pattern Replication," J. Vac. Sci. Technol., B14(6), Nov./Dec. 1996.
Korean Office Action dated Nov. 27, 2012 in corresponding Korean Patent Application No. 10-2010-0091404.
Japanese Office Action mailed Mar. 15, 2013 in corresponding Japanese Patent Application No. 2010-206182.
Chinese Office Action dated Jun. 7, 2013 in corresponding Chinese Patent Application No. 201010294425.
Japanese Office Action mailed Oct. 3, 2013 in corresponding Japanese Patent Application No. 2010-206182.
Japanese Decision of Dismissal of Amendment Oct. 15, 2013 in corresponding Japanese Patent Application No. 2010-206182.

* cited by examiner

IMPRINT LITHOGRAPHY METHOD

This application claims priority and benefit under 35 U.S.C. §119(e) to U.S. Provisional Patent Application No. 61/244,746, entitled "Imprint Lithography Method and Apparatus", filed on Sep. 22, 2009. The content of that application is incorporated herein in its entirety by reference.

FIELD

The present invention relates to an imprint lithography method and apparatus.

BACKGROUND

In lithography, there is an ongoing desire to reduce the size of features in a lithographic pattern in order to increase the density of features on a given substrate area. In photolithography, the push for smaller features has resulted in the development of technologies such as immersion lithography and extreme ultraviolet (EUV) lithography, which are however rather costly.

A potentially less costly road to smaller features (e.g., nanometer sized features or sub micron sized features) that has gained increasing interest is so-called imprint lithography, which generally involves the use of a "stamp" (often referred to as an imprint template or an imprint lithography template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

Imprint lithography involves the patterning of an imprintable medium on a surface of a substrate to be patterned. The patterning may involve bringing together a patterned surface of an imprint template and a layer of imprintable medium (e.g., moving the imprint template toward the imprintable medium, or moving the imprintable medium toward the imprint template, or both) such that the imprintable medium flows into recesses in the patterned surface and is pushed aside by protrusions on the patterned surface. The recesses define pattern features of the patterned surface of the imprint template. Typically, the imprintable medium is flowable when the patterned surface and the imprintable medium are brought together. Following patterning of the imprintable medium, the imprintable medium is suitably brought into a non-flowable or frozen state (i.e. a fixed state), for example by illuminating the imprintable medium with actinic radiation. The patterned surface of the imprint template and the patterned imprintable medium are then separated. The substrate and patterned imprintable medium are then typically processed further in order to pattern or further pattern the substrate. The imprintable medium is typically provided in the form of droplets on the surface of a substrate to be patterned, but may alternatively be provided using spin coating or the like.

SUMMARY

A problem arising from using actinic radiation is that a considerable period of time may be required in order to deliver a dose of actinic radiation which is sufficient to bring the imprintable medium into a non-flowable or frozen state. This may reduce the throughput of the imprint lithography apparatus.

According to an aspect, there is provided an imprint lithography method comprising bringing an imprint template into contact with imprintable medium provided on a substrate, and directing actinic radiation at the imprintable medium, the actinic radiation being oriented such that it is not perpendicularly incident upon a patterned surface of the imprint template.

According to an aspect, there is provided an imprint lithography apparatus comprising an imprint template and an outlet of actinic radiation, wherein the outlet of actinic radiation and the imprint template are configured to deliver actinic radiation which is oriented such that it is not perpendicularly incident upon a patterned surface of the imprint template.

According to an aspect, there is provided an imprint lithography apparatus comprising an imprint template holder, wherein the imprint template holder comprises a structure which is configured to deliver actinic radiation from a source of actinic radiation into an imprint template such that it is incident upon a patterned surface of the imprint template at a non-perpendicular angle.

According to an aspect, there is provided an imprint lithography apparatus comprising an outlet of actinic radiation which is configured such that during use it delivers actinic radiation into an imprint template such that it is incident upon a patterned surface of the imprint template at a non-perpendicular angle.

According to an aspect, there is provided An imprint lithography template having an actinic radiation receiving face which is not parallel to a patterned surface of the imprint template.

BRIEF DESCRIPTION OF THE DRAWINGS

Specific embodiments of the invention will be described with reference to the accompanying Figures, in which.

DETAILED DESCRIPTION

Figure 1:
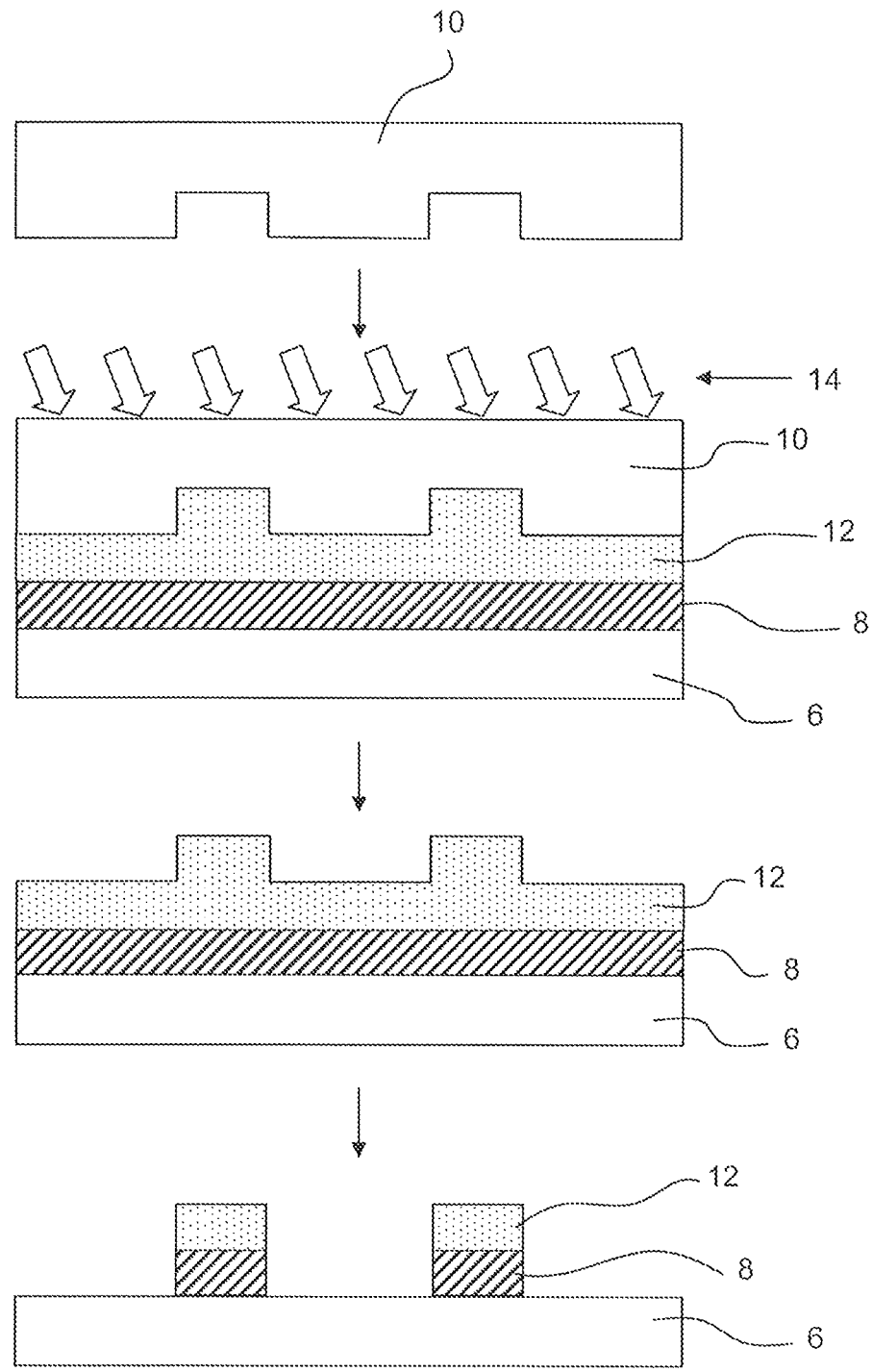
FIG. 1 schematically depicts an imprint lithography method according to an embodiment of the invention.

FIG. 1 schematically illustrates an embodiment of the invention. A substrate 6 is provided with a layer of imprintable medium 12. A planarization layer 8 is provided between the substrate 6 and the imprintable medium 12. The planarization layer is optional, and in some instances may not be present. A radiation transmissive (e.g., quartz) imprint template 10 is applied to the imprintable medium 12, thereby forming a pattern in the imprintable medium. The pattern is frozen in the imprintable medium 12 by curing the imprintable medium with actinic radiation 14 that passes through the imprint template 10 onto the imprintable medium 12. The actinic radiation 14 passes into the imprint template 10 at a non-perpendicular angle relative to a patterned surface of the imprint template. The template 10 is removed from the imprintable medium 12, which retains the imprinted pattern. The imprintable medium 12 is then etched, thereby forming a pattern in the planarization layer 8.

Since the actinic radiation 14 passes into the imprintable medium 12 at a non-perpendicular angle, it is also incident upon the surface of the substrate 6 at a non-perpendicular angle. The amount of actinic radiation which is absorbed by the substrate 6 is reduced, compared with the amount that would have been absorbed if the actinic radiation were perpendicularly incident upon the substrate.

Since the amount of actinic radiation which is absorbed by the substrate is reduced, heating of the substrate by the actinic radiation is reduced, thereby reducing the extent to which thermal expansion of the substrate occurs due to heating. Reducing the amount of thermal expansion of the substrate is advantageous, since the thermal expansion may reduce the accuracy with which a pattern is formed on the substrate.

It may be the case that there is a threshold amount of heating of the substrate due to actinic radiation which is acceptable. For example, it may be the case that if heating of the substrate is kept below that threshold, then patterns may be formed on the substrate with a desired accuracy. Embodiments of the invention reduce the amount of heat which is absorbed by the substrate from actinic radiation, thereby helping to ensure that heating of the substrate remains below the threshold.

Embodiments of the invention may allow the intensity of the actinic radiation delivered to the imprintable medium to be increased, thereby reducing the time required to cure the imprintable medium. This increases the throughput of the lithographic apparatus (i.e. the number of substrates which can be patterned per hour).

Figure 2:
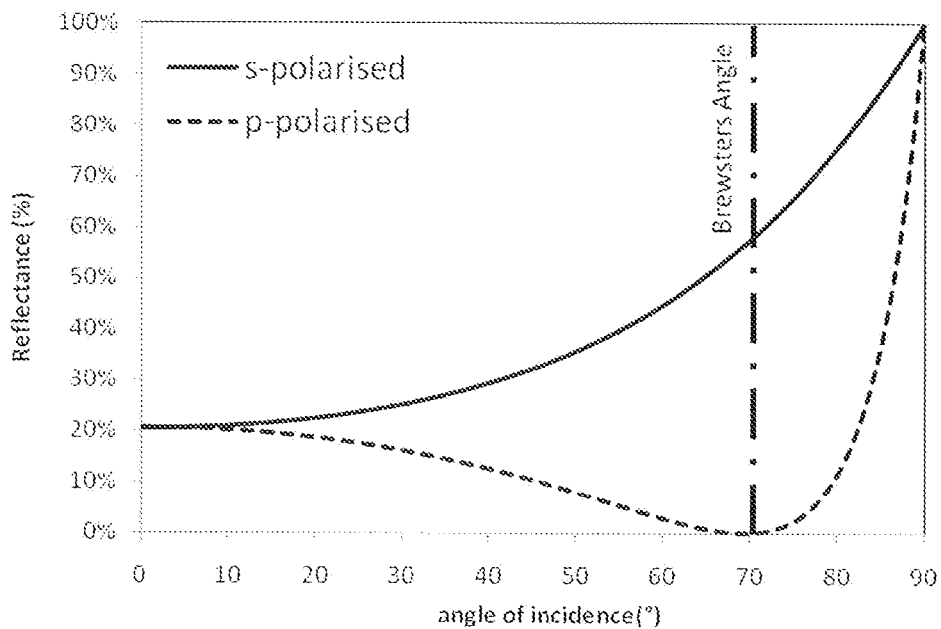
FIG. 2 is a graph which shows the reflectance of an interface between quartz and a silicon substrate.

FIG. 2 is a graph which shows how the reflectance of incident radiation changes as a function of angle of incidence at an interface between quartz ($SiO_2$) and silicon (e.g. an interface between a quartz imprint template and a silicon substrate). The angle in FIG. 2 is measured relative to the perpendicular from the interface. The radiation is UV radiation, for example having a wavelength in the range of 200 nm to 400 nm, for example having a wavelength of 300 nm.

As can be seen from FIG. 2, the reflectance is dependent upon the polarization of the incident radiation. When the radiation is perpendicularly incident upon the interface (i.e. 0° in FIG. 2), then the reflectance of the radiation is 22%. As the angle of incidence increases, the reflectance of s-polarized radiation increases gradually, rising to 50% at around 65° angle of incidence, and rising to 80% at around 80° angle of incidence. In contrast to this, the reflectance of the p-polarized radiation drops steadily from 20% down to 0 at around 70°, and then rises very steeply at angles greater than 70° (70° is Brewster's angle for this interface, and is the angle at which all p-polarized radiation is absorbed by the silicon).

Since absorbance is the inverse of reflectance, an increase of the reflectance at the interface corresponds to a decrease of the absorbance (i.e. the amount of radiation which is absorbed by the silicon substrate). It can be seen from FIG. 2 that it is possible to reduce the amount of radiation which is absorbed by a silicon substrate at a quartz-silicon interface via selection of the angle at which radiation is incident upon the interface. This may be done in combination with selection of a particular polarization of the radiation.

One way in which the reflectance may be increased is to use s-polarized actinic radiation, and direct the actinic radiation at the interface at an angle which is not perpendicular to the interface. The angle may for example be greater than 30°, greater than 50°, or greater than 70°.

In an alternative arrangement, the actinic radiation may be non-polarized, or include a p-polarized component. The actinic radiation may be directed at the interface at an angle which is not perpendicular to the interface. The actinic radiation may for example be directed at the interface at an angle which is greater than 80°, or greater than 85°.

S-polarized actinic radiation may be obtained in a variety of ways. For example, a source which generates polarized actinic radiation may be used. Alternatively, the source may generate non-polarized radiation, and a polarizing filter may be used to provide the s-polarized radiation. The polarizing filter may for example comprise a transmissive filter, or may alternatively comprise a reflective filter. For example, the reflective filter may be a surface which is orientated at Brewster's angle relative to the incident actinic radiation, such that the surface reflects only s-polarized radiation.

Figure 3:
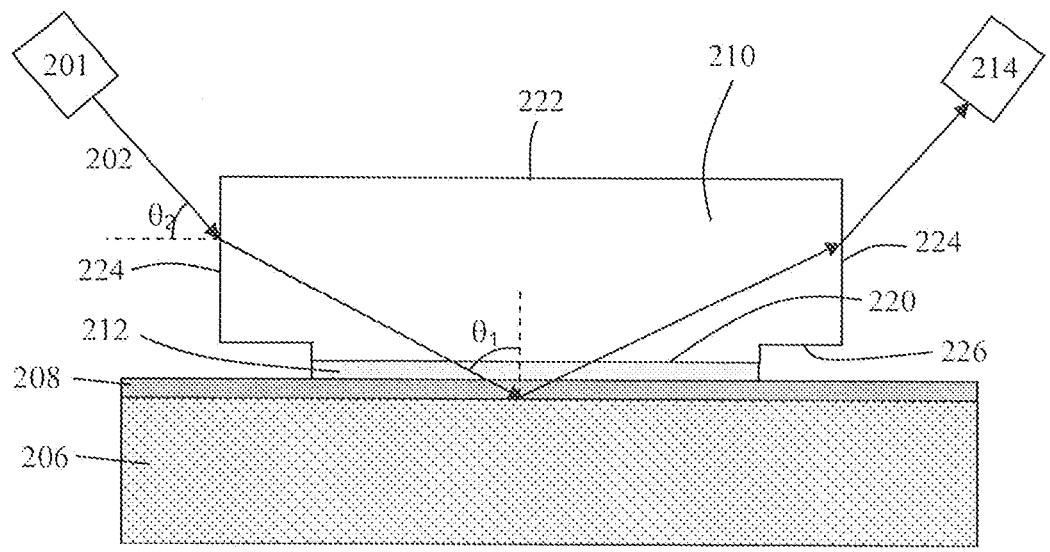
FIG. 3 schematically depicts an imprint lithography apparatus according to an embodiment of the invention.

FIG. 3 schematically shows an imprint lithography apparatus according to an embodiment of the invention. An imprint template 210 has a patterned surface 220, an upper surface 222, and one or more side-faces 224 which connect the patterned surface and the upper surface. The patterned surface 220 may include one or more non-patterned regions 226.

An outlet of actinic radiation 201, comprising, in an embodiment, a source of actinic radiation, is arranged to direct s-polarized actinic radiation 202 at a side-face 224 of the imprint template 210. The imprint template 210 is surrounded by air or another gas (e.g. helium or a helium/air mixture), and consequently the actinic radiation passes through a gas-quartz interface as it enters the imprint template (in the case where the imprint template is formed from quartz). The actinic radiation 202 therefore undergoes refraction and bends towards a normal relative to the side-face 224 of the imprint template.

On leaving the imprint template 210, the actinic radiation 202 then enters imprintable medium 212. The imprintable medium 212 may for example be silicon-based and may have a refractive index which is similar to that of the imprint template 210 (e.g. n=1.46). The actinic radiation 202 therefore does not undergo significant refraction when it is incident upon the imprintable medium 212. The actinic radiation 202 then passes into a planarization layer 208. Again, the refractive index of the planarization layer may be similar to that of the imprintable medium, such that the actinic radiation 202 does not undergo significant refraction when it enters the planarization layer 208.

On leaving the planarization layer, the actinic radiation 202 is then incident upon the substrate 206. The substrate 206 may for example be formed from silicon, which has a refractive index of n=4. A proportion of the actinic radiation 202 is reflected from the substrate 206, and the remainder is absorbed by the substrate 206.

Figure 4:
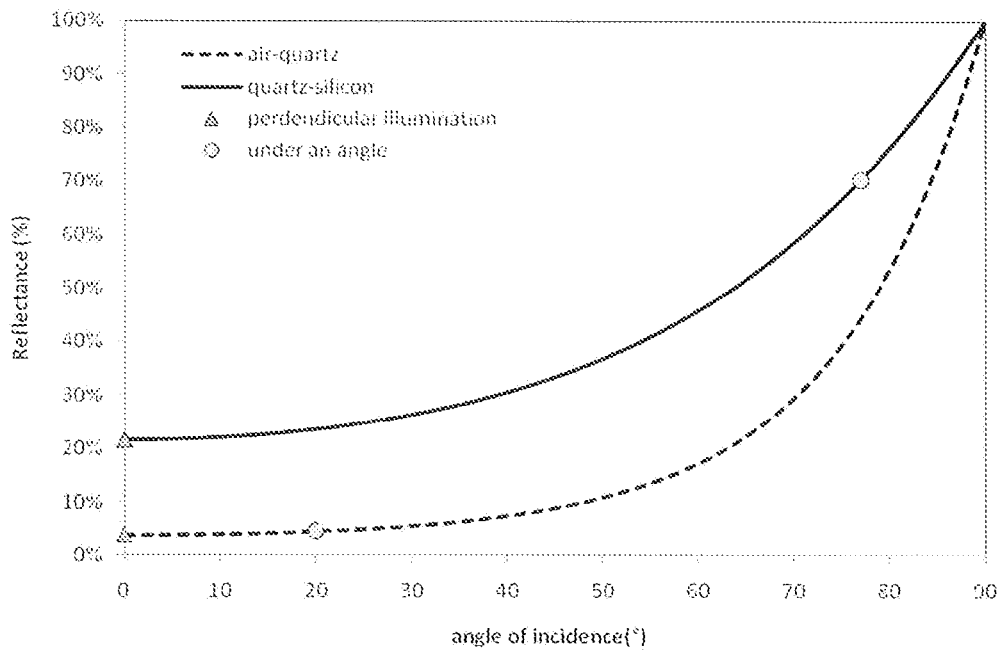
FIG. 4 is a graph which shows reflectance values which may be seen in embodiments of the invention.

FIG. 4 is a graph which shows how the reflectance experienced by s-polarized actinic radiation 202 varies as a function of the angle of incidence of the radiation on an interface. For ease of terminology, the angle of incidence is measured relative to a perpendicular from the interface in question. The reflectance experienced at the air-quartz interface is shown as a dashed line, and the reflectance experienced by the quartz-silicon interface (or equivalently resist-silicon or planarization layer-silicon) is shown as a solid line.

It can be seen from FIG. 4 that if the actinic radiation is incident upon the side-face 224 of the imprint template 210 with an angle of incidence $\theta_2$ of 0° (i.e. perpendicular to the face), then less than 5% of the actinic radiation is reflected from the side-face of the imprint template. As the angle of incidence $\theta_2$ is increased, for example to 40°, the amount of actinic radiation which is reflected from the side-face of the imprint template 210 increases very slowly. At an angle of incidence $\theta_2$ of 50° around 10% of the actinic radiation is reflected from the side-face of the imprint template. At an angle of incidence $\theta_2$ of 60° around 30% of the incident actinic radiation is reflected from the side-face of the imprint template. Thus, it can be seen from FIG. 4 that moving the angle of incidence $\theta_2$ of the actinic radiation away from being perpendicular to the face of the imprint template still allows a large proportion of the actinic radiation to enter the imprint template. Since high intensity sources of actinic radiation are relatively inexpensive, losing some of the actinic radiation to reflection from the imprint template is not a significant disadvantage.

It can be seen from FIG. 4 that if the actinic radiation is incident upon the substrate 206 with an angle of incidence $\theta_1$ of 0° (i.e. perpendicular to the substrate), then around 20% of the actinic radiation is reflected from the substrate (the remaining 80% being absorbed by the substrate). As the angle of incidence $\theta_1$ increases, the reflectance of the imprint template-substrate interface increases gradually, rising to 50% at around 65° angle of incidence, and rising to 80% at around 80° angle of incidence. The absorption of the actinic radiation thus correspondingly reduces to 50% at around 65° angle of incidence $\theta_1$, and reduces to 20% at around 80° angle of incidence.

Using the curves shown in FIG. 4, and taking into account refraction of actinic radiation at the air-quartz interface, an angle of incidence of the actinic radiation 202 on the side-face of the imprint template 210 may be chosen which provides reduced absorption of actinic radiation by the substrate (compared with actinic radiation which is perpendicularly incident upon the imprint template and the substrate).

In one example, actinic radiation 202 may be incident upon a side-face 224 of the imprint template 210 at an angle of incidence $\theta_2$ of 5°. Due to refraction, the actinic radiation will travel in the imprint template 210 at an angle of 3.3°, measured relative to a perpendicular from the side-face of the imprint template. This corresponds to an angle of 86.7° relative to a perpendicular from the substrate 206. The actinic radiation 202 is thus incident upon the planarization layer-substrate interface at an angle of 86.7°. FIG. 4 indicates that around 90% of the actinic radiation is reflected from the substrate at that angle. Thus, only 10% of the actinic radiation will be absorbed by the substrate 206.

Absorption of 10% of the actinic radiation 202 compares very favorably with absorption of around 80% which may be seen when the actinic radiation is perpendicularly incident upon the substrate.

The reduced absorption of the actinic radiation reduces heating of the substrate, thereby reducing thermal expansion of the substrate. This in turn may allow a higher intensity of actinic radiation to be used while maintaining a desired accuracy of patterning.

The actinic radiation may be incident upon the side-face of the imprint template 210 with some other angle of incidence $\theta_2$.

Actinic radiation which is reflected from the substrate 206 and which passes out of the imprint template 210 may for example be incident upon a beam-stop 214 which is configured to absorb the actinic radiation.

Although the actinic radiation 202 is shown as being incident upon only one side-face or one part of the side-face of the imprint template 210, the actinic radiation may be incident upon more than one side-face or more than one part of the side-face of the imprint template. For example, the actinic radiation may be incident upon opposite side-faces of the imprint template. This may help to provide a more even distribution of actinic radiation in the imprintable medium 212 than would be the case if the actinic radiation was incident upon only one side-face of the imprint template.

Figure 5:
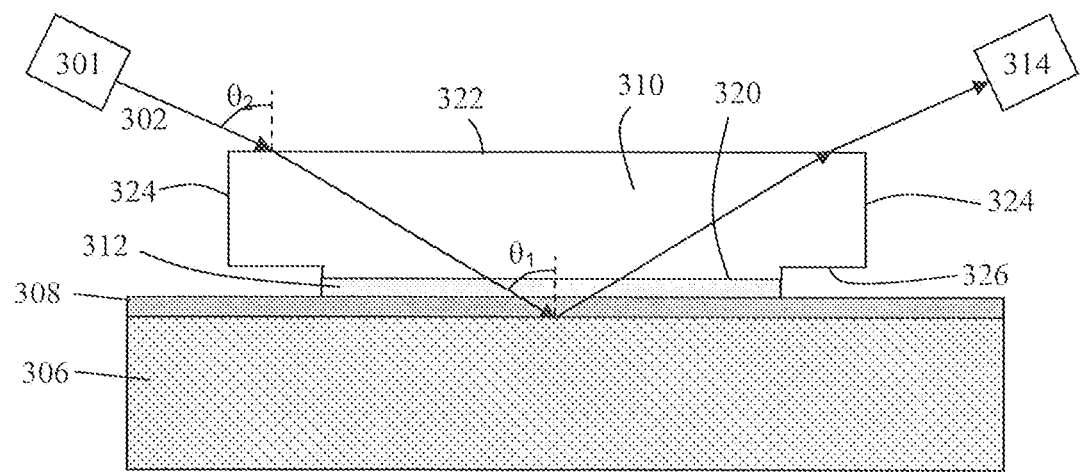
FIG. 5 schematically depicts an imprint lithography apparatus according to an embodiment of the invention.

FIG. 5 schematically shows an imprint lithography apparatus according to a further embodiment of the invention. An imprint template 310 has a patterned surface 320, an upper surface 322, and one or more side-faces 324 which connect the patterned surface and the upper surface. The patterned surface 320 may include one or more non-patterned regions 326. A substrate 306 is provided with a planarization layer 308. Imprintable medium 312 is provided on the planarization layer. The imprint template 310 is in contact with the imprintable medium 312.

For ease of description, the surface 322 which is opposite the patterned surface 320 is referred to herein as the upper surface 322. This is not intended to mean that the imprint template 310 has a particular orientation. Although the upper surface 322 is above the patterned surface 320 in FIG. 5, the imprint template may have some other orientation such that this is not the case.

An outlet of actinic radiation 301 is configured to direct s-polarized actinic radiation 302 towards the upper surface 322 of the imprint template 310 instead of a side-face of the imprint template. The actinic radiation is incident upon the upper surface of the imprint template 310 with a non-perpendicular angle of incidence $\theta_2$.

Actinic radiation which is reflected from the substrate 306 and which passes out of the imprint template 310 may for example be incident upon a beam-stop 314 which is configured to absorb the actinic radiation.

Reflection of the actinic radiation from the upper surface 322 of the imprint template 310 is as indicated in FIG. 4. For example, if an angle of incidence $\theta_2$ at the imprint template of 70° is chosen, then around 30% of the actinic radiation will be reflected from the imprint template (the remainder will pass into the imprint template). This reflected actinic radiation may for example be captured by a beam stop (not shown). Due to refraction, actinic radiation will travel at an angle of 39° in the imprint template 310, and will have an angle of incidence $\theta_1$ of 39° at the substrate 306. Referring to FIG. 4, the actinic radiation will experience a reflectance of around 30% (i.e. around 70% of the actinic radiation will be absorbed by the substrate).

The actinic radiation may be incident upon the upper surface 322 of the imprint template 310 with any other non-perpendicular angle of incidence $\theta_2$.

The angle of incidence $\theta_1$ at the substrate 306 cannot exceed 42° in this particular example. This is because 42° is the critical angle for a quartz-air interface. In other words, there is no angle of incidence $\theta_2$ at the upper surface 322 of the imprint template 310 that will provide an angle of incidence $\theta_1$ at the substrate which is greater than 42°. If the air which surrounds the imprint template 310 were to be replaced with a gas having a different refractive index than air, then the value of the angle of incidence $\theta_1$ which cannot be exceeded would change accordingly. Similarly, if the imprint template 310 were to be replaced with an imprint template having a different refractive index than quartz, then the value of the angle of incidence $\theta_1$ which cannot be exceeded would change accordingly. If the imprintable medium 312 or the planarization layer 308 were to have a refractive index which is not the same as or similar to quartz, then this would also change the value of the angle of incidence $\theta_1$ which cannot be exceeded.

A structure may be provided which allows actinic radiation to be coupled into an imprint template such that it is incident upon a substrate with a desired angle of incidence. The structure may be integrally formed with the imprint template. The structure may be a prism.

Figure 6:
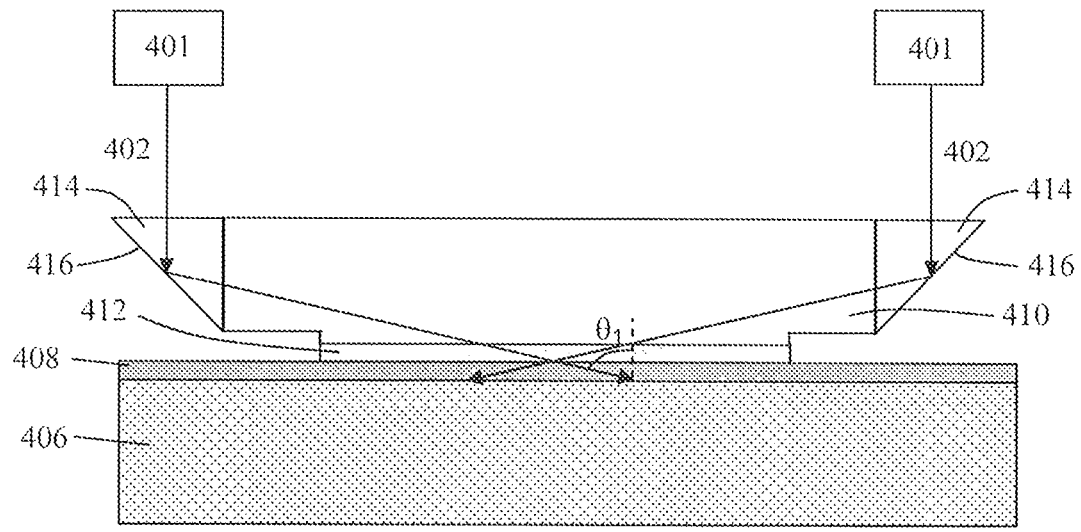
FIG. 6 schematically depicts an imprint lithography apparatus according to an embodiment of the invention.

FIG. 6 schematically shows an imprint lithography apparatus according to an embodiment of the invention. In this embodiment an imprint template 410, imprintable medium 412, planarization layer 408 and substrate 406 are similar to those shown in FIG. 5. However, a prism 414 is provided at a side of the imprint template 410, e.g., at each of two sides of the prism 414. In an embodiment, the prism 414 is formed from the same material as the imprint template (e.g. quartz). The prism 414 is in optical communication with the imprint template 410. The prism 414 may be in contact with the imprint template 410. A fluid, such as an index-matching fluid, may be present at an interface between the prism 414 and the imprint template 410. The prism 414 may be provided with a reflective surface 416 (e.g. by providing a reflective material at that surface).

An outlet of actinic radiation 401 is configured to direct s-polarized actinic radiation 402 towards the prism 414. For example, the actinic 402 may be perpendicularly incident upon an upper surface of the prism 414. Since the actinic radiation is perpendicularly incident upon the prism 414, referring to FIG. 4 it may be seen that more than 95% of the actinic radiation passes into the prism 414. The actinic radiation 402 is reflected from the reflective surface 416 of the prism 414, and travels towards the imprint template. Since the prism 414 and imprint template 410 are formed from the same material (and may have index matching fluid at an interface between them), the actinic radiation does not undergo significant refraction or reflection when it passes into the imprint template. The actinic radiation 402 is incident upon the substrate 406 at an angle which is determined by the orientation of the reflective surface 416 of the prism 414. Referring to FIG. 4, for example, if the actinic radiation were to be incident upon the substrate with an incident angle $\theta_1$ of 75°, then around 70% of the actinic radiation would be reflected from the substrate (i.e. only around 30% of the actinic radiation would be absorbed by the substrate).

The orientation of the reflective surface 416 of the prism 414 may be selected such that the actinic radiation is incident upon the substrate 406 with a desired incident angle. The orientation of the reflective surface 416 of the prism 414 may be selected, in combination with the angle of incidence of the actinic radiation on the prisms, such that the actinic radiation is incident upon the substrate 406 with a desired incident angle.

The angle which the reflective surface 416 of the prism 414 subtends relative to a normal from the surface of the substrate 406 may for example be less than 45°.

The prism 414 (or other structure) may form part of an imprint template holder which is configured to hold an imprint template. In such an arrangement, the imprint template 410 may be removed from the imprint template holder, and replaced with a replacement imprint template. The replacement imprint template would contact the prism 414 (possibly with a fluid such as an index matching fluid between them), thereby allowing actinic radiation to pass into the replacement imprint template in the manner shown in FIG. 6.

The prism 414 may be integrally formed with the imprint template 410 (e.g. formed from a single piece of material such as quartz).

A structure may be provided that has an actinic radiation receiving face which is not parallel to or perpendicular to the patterned surface of the imprint template. The structure may allow actinic radiation to be coupled into an imprint template such that it is incident upon a substrate with a desired angle of incidence. The structure may be integrally formed with the imprint template. The structure may be a prism. The structure may be a lens.

Figure 7:
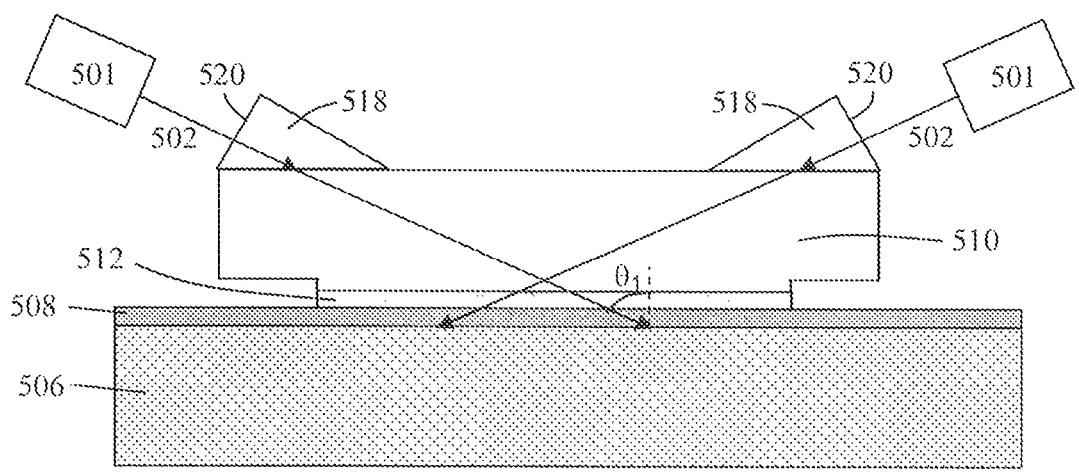
FIG. 7 schematically depicts an imprint lithography apparatus according to an embodiment of the invention.

FIG. 7 schematically shows an imprint lithography apparatus according to a further embodiment of the invention. In this embodiment, an imprint template 510, imprintable medium 512, planarization layer 508 and substrate 506 are similar to those shown in FIG. 5. However, a prism 518 is provided at an upper surface of the imprint template 510, e.g., at each of two sides of the imprint template 510. The prism 518 is in optical communication with the imprint template 510. The prism 518 may be in contact with the imprint template 510. The prism 518 is configured such that it has a radiation receiving face 520 which receives perpendicularly incident actinic s-polarized radiation 502 from an actinic radiation outlet 501. In an embodiment, the prism 518 is formed from the same material as the imprint template 510 (for example quartz). A fluid such as an index matching fluid may be provided between the prism 518 and the imprint template 510.

Actinic radiation 502 is perpendicularly incident upon the radiation receiving face 520 of the prism 518. Referring to FIG. 4, this means that in excess of 95% of the actinic radiation passes into the prism 518. The actinic radiation passes without significant deviation into the imprint template 510. The actinic radiation is incident upon the substrate 506 with an angle of incidence $\theta_1$ of, for example, around 65°. Referring to FIG. 4, around 50% of the actinic radiation is thus reflected from the substrate (the remaining 50% being absorbed by the substrate).

The angle of incidence $\theta_1$ of the actinic radiation 502 upon the substrate 506 may be selected for example by modifying the angle at which the actinic radiation is incident upon the prism 518.

The actinic radiation 502 may have a non-perpendicular angle of incidence at the radiation receiving face 520 of the prism 518. The prism 518 may have a shape which is selected such that the actinic radiation is incident upon the prism with an angle of incidence of 90°, 80° or more, 70° or more, etc. The prism 518 may have any shape which allows actinic radiation to be coupled to the imprint template. The prism may have any shape such that actinic radiation may be made to be incident upon the substrate 506 with a desired angle of incidence $\theta_1$.

The prism 518 may be integrally formed with the imprint template 510 (e.g. formed from a single piece of material such as quartz).

Although the prisms 414, 518 have been described as being formed from the same material as the imprint template 410, 510, the prisms (or other structures) may be formed from any suitable material. A prism (or other structure) may for example be formed from a material which has a higher refractive index than the imprint template, or may be formed from a material which has a lower refractive index than the imprint template.

Figure 8:
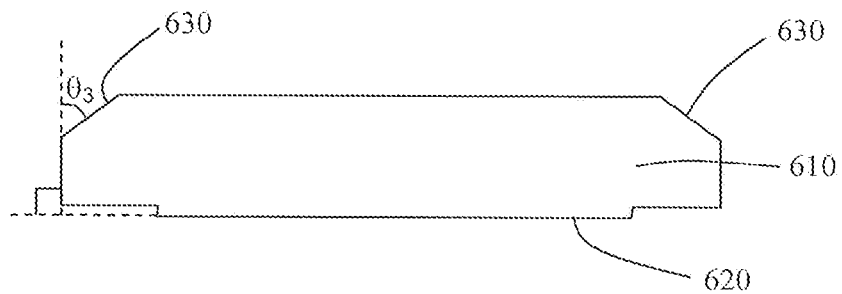
FIG. 8 schematically depicts an imprint template according to an embodiment of the invention.

FIG. 8 schematically shows an imprint template 610 according to a further embodiment of the invention. An actinic radiation receiving surface 630 of the imprint template is neither parallel to or perpendicular to a patterned surface 620 of the imprint template. The actinic radiation receiving surface is at an angle $\theta_3$ of 45° relative to a perpendicular from the patterned surface 620 of the imprint template. The actinic radiation receiving surface may be at an angle $\theta_3$ of 70 degrees or less, 45 degrees or less, or 30 degrees or less relative to a perpendicular from the patterned surface 620 of the imprint template. Any number of actinic radiation receiving surfaces may be provided.

The extent to which the actinic radiation is reflected from the substrate will depend upon the difference between the refractive index of the substrate and the refractive index of the imprint template. The degree to which radiation is reflected from an interface between two materials is governed by the Fresnel equations:

$$R_s = \left(\frac{\sin(\theta_r - \theta_1)}{\sin(\theta_r + \theta_1)}\right)^2 = \left(\frac{n_1 \cos\theta_1 - n_2 \cos\theta_r}{n_1 \cos\theta_1 + n_2 \cos\theta_r}\right)^2 \quad (1)$$

$$R_p = \left(\frac{\tan(\theta_r - \theta_1)}{\tan(\theta_r + \theta_1)}\right)^2 = \left(\frac{n_1 \cos\theta_r - n_2 \cos\theta_1}{n_1 \cos\theta_r + n_2 \cos\theta_1}\right)^2 \quad (2)$$

where $R_s$ is the reflection of s-polarized radiation, $R_p$ is the reflection of p-polarized radiation, $n_1$ is the refractive index of the first material, $n_2$ is the refractive index of the second material, $\theta_1$ is the angle of incidence of the radiation, and $\theta_r$ is the angle of refraction of the radiation. Snell's law is:

$$n_1 \sin \theta_1 = n_2 \sin \theta_r \quad (3)$$

Snell's law can be used to simplify equations 1 and 2 so that they depend only on the refractive indices $n_1$, $n_2$ of the first and second materials, and the angle of incidence $\theta_1$:

$$R_s = \left(\frac{n_1 \cos\theta_1 - n_2 \sqrt{1 - \left(\frac{n_1}{n_2}\sin\theta_1\right)^2}}{n_1 \cos\theta_1 + n_2 \sqrt{1 - \left(\frac{n_1}{n_2}\sin\theta_1\right)^2}}\right)^2 \quad (4)$$

$$R_p = \left(\frac{n_1 \sqrt{1 - \left(\frac{n_1}{n_2}\sin\theta_1\right)^2} - n_2 \cos\theta_1}{n_1 \sqrt{1 - \left(\frac{n_1}{n_2}\sin\theta_1\right)^2} + n_2 \cos\theta_1}\right)^2 \quad (5)$$

Equations 4 and 5 may be used, together with knowledge of the refractive index of the imprint template and the substrate, to determine a suitable angle of incidence for actinic radiation.

Figure 9:
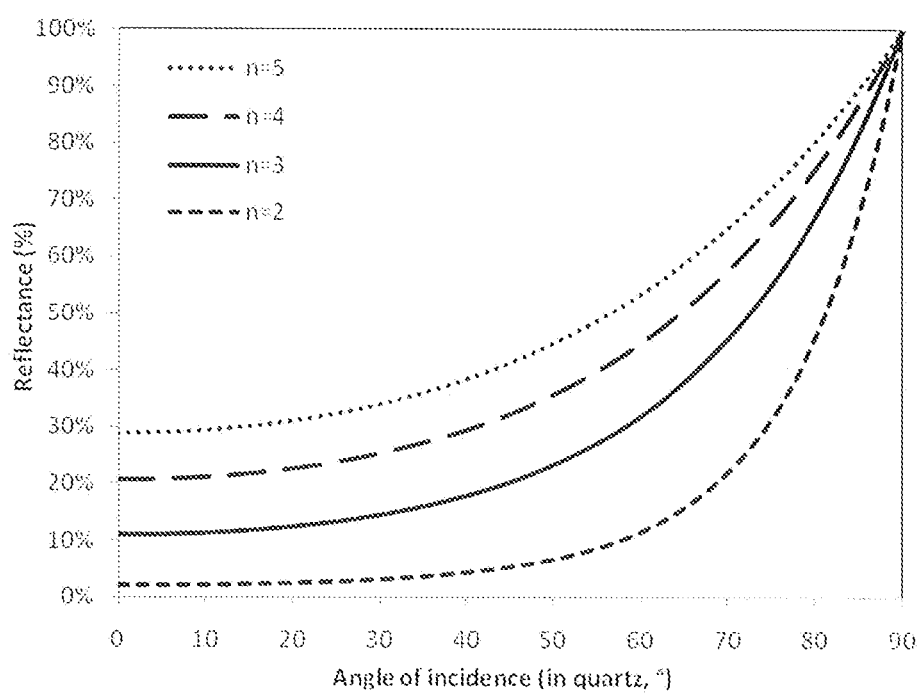
FIG. 9 is a graph which shows reflectance values which may be seen in embodiments of the invention.

If s-polarized actinic radiation is used, and p-polarized radiation is not used, then only equation 4 is required. FIG. 9 is a graph which shows how the reflectance of s-polarized radiation varies as a function of angle of incidence upon substrates having different refractive indices. The graph was generated for a first material (e.g. an imprint template) having a refractive index of $n_1$ of 1.5, and shows reflectance curves for a second material (e.g. a substrate) having a refractive index $n_2$ of 2, 3, 4 or 5.

It can be seen from FIG. 9 that the reflectance increases as the refractive index of the substrate increases. This is because the difference between the refractive index of the substrate and the refractive index of the imprint template increases. The greater the difference between the refractive index of the substrate and the refractive index of the imprint template, the greater the reflectance. The difference between the refractive index of the substrate and the refractive index of the imprint template may for example be greater than 0.5, greater than 1, greater than 2, or more.

From FIG. 9 it may be seen that an angle of incidence $\theta_1$ upon a substrate of 30° provides a significant increase of reflectance. The angle of incidence $\theta_1$ may for example be greater than 30°, greater than 45°, greater than 60°, greater than 70°. In an embodiment, a lithographic apparatus may be configured to provide an angle of incidence greater than 30°, greater than 45°, greater than 60°, greater than 70°.

References to the angle of incidence $\theta_1$ upon a substrate may be considered to be equivalent to the angle of incidence upon a patterned surface of an imprint template.

Embodiments of the invention may provide an actinic radiation receiving face which is neither parallel to or transverse to the patterned surface of the imprint template, and which is configured to couple actinic radiation into the imprint template.

In the above equations and FIG. 9 it is assumed for simplicity that the imprint template is in contact with the substrate. In practice, it is the imprintable medium that is in contact with the substrate (or the planarization layer if a planarization layer is present). It may be assumed that the imprintable medium and the planarization layer have the same refractive index as the imprint template. Alternatively, the equations and FIG. 9 may be modified to take into account the refractive index of the imprintable medium and the refractive index of the planarization layer (if the planarization layer is present). The equations and FIG. 9 may be modified to take into account any other layer which may be present.

The actinic radiation may for example be UV radiation, for example having a wavelength of 300 nm. The actinic radiation may have any suitable wavelength.

In illustrated embodiments of the invention, the actinic radiation outlet and/or source has been shown as being adjacent to the imprint template. It is not necessary that this is the case. The actinic radiation outlet and/or source may be provided in any suitable location.

One or more actinic radiation outlets and/or sources may be provided.

In FIGS. 1, 3 and 5 actinic radiation is shown as being incident upon the imprintable medium from only one direction, whereas in FIGS. 6 and 7 actinic radiation is incident upon the imprintable medium from different directions. Wherein the actinic radiation is incident upon the imprintable medium from different directions, this may improve evenness with which actinic radiation is distributed across the imprintable medium. The different directions may be opposite directions (e.g. as shown in FIGS. 6 and 7), or may be any other directions.

One or more beam stops may be used to absorb actinic radiation which is not absorbed by the imprintable medium.

The above description refers to an angle of incidence relative to the patterned surface of an imprint template. The patterned surface may include recesses, and therefore may not be a simple planar surface. For the purpose of defining the angle of incidence of actinic radiation however, the patterned surface of the imprint template may be treated as a planar surface.

Although the imprint template 10, 210, 310, 410, 510, 610 is described as being formed from quartz, the imprint template may be formed from any suitable material.

In the above embodiments, a single imprint template, a single imprint template holder, a single substrate holder and a single substrate is provided in a single chamber. In other embodiments, more than one imprint template, more than one imprint template holder, more than one substrate holder, and/or more than one substrate may be provided in one or more chambers. This may allow imprints to be undertaken more efficiently or quickly (e.g. in parallel). For example, in an embodiment, there is provided an apparatus that includes a plurality (e.g. 2, 3, or 4) of substrate holders. In an embodiment, there is provided an apparatus that includes a plurality (e.g. 2, 3, or 4) of imprint templates. The plurality of imprint templates may for example be used to pattern the same substrate. In an embodiment, there is provided an apparatus configured to use one template holder per substrate holder. In an embodiment, there is provided an apparatus configured to use more than one template holder per substrate holder. In an embodiment, there is provided an apparatus that includes a plurality (e.g. 2, 3, or 4) of imprintable medium dispensers. In an embodiment, there is provided an apparatus configured to use one imprintable medium dispenser per substrate holder. In an embodiment, there is provided an apparatus configured to use one imprintable medium dispenser per imprint template. In an embodiment, where an apparatus is provided that includes a plurality of substrate holders, the substrate holders may share functionalities in the apparatus. For instance, the substrate holders may share a substrate handler, a substrate cassette, a gas supply system (e.g. to create a helium environment during imprinting), an imprintable medium dispenser, and/or a radiation source (for curing the imprintable medium). In an embodiment, two or more of the substrate holders (e.g. 3 or 4) share one or more functionalities of the apparatus (e.g. 1, 2, 3, 4, or 5 functionalities). In an embodiment, one or more functionalities (e.g. 1, 2, 3, 4, or 5) of the apparatus are shared among all substrate holders.

In an embodiment, a lithographic apparatus is provided that includes a plurality of imprint templates (or imprint template holders). An actinic radiation outlet and/or source may be configured to provide actinic radiation to more than one imprint template (or more than one imprint template holder).

Embodiments of the invention may utilize so-called step and flash imprint lithography (SFIL), which may be used to pattern a substrate in small steps in a similar manner to optical steppers conventionally used in IC manufacture. For more information on UV imprint, see e.g. U.S. Patent Application Publication No. US 2004-0124566, U.S. Pat. No. 6,334,960, PCT Patent Application Publication No. WO 02/067055, and the article by J. Haisma entitled "Mold-assisted nanolithography: A process for reliable pattern replication", J. Vac. Sci. Technol. B14(6), November/December 1996.

The present invention relates to imprint lithography apparatus and methods. The apparatus and/or methods may be used for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, organic light emitting diodes, etc.

While specific embodiments of the invention have been described above, it will be appreciated that the invention may be practiced otherwise than as described. For example, the invention may take the form of one or more computer programs containing one or more sequences of machine-readable instructions describing a method as disclosed above, or one or more data storage medium (e.g. semiconductor memory, magnetic or optical disk) having such one or more computer program stored therein.

The described and illustrated embodiments are to be considered as illustrative and not restrictive in character, it being understood that only the preferred embodiments have been shown and described and that all changes and modifications that come within the scope of the inventions as defined in the claims are desired to be protected. It should be understood that while the use of words such as "preferable", "preferably", "preferred" or "more preferred" in the description suggest that a feature so described may be desirable, it may nevertheless not be necessary and embodiments lacking such a feature may be contemplated as within the scope of the invention as defined in the appended claims. In relation to the claims, it is intended that when words such as "a," "an," "at least one," or "at least one portion" are used to preface a feature there is no intention to limit the claim to only one such feature unless specifically stated to the contrary in the claim. When the language "at least a portion" and/or "a portion" is used the item can include a portion and/or the entire item unless specifically stated to the contrary.

Embodiments of the invention are provided in below numbered clauses:

1. An imprint lithography method comprising bringing an imprint template into contact with imprintable medium provided on a substrate, and directing actinic radiation at the imprintable medium, the actinic radiation being oriented such that it is not perpendicularly incident upon a patterned surface of the imprint template.

2. The method of clause 1, wherein the angle of incidence of the actinic radiation on the patterned surface of the imprint template is greater than 30°.

3. The method of clause 1 or clause 2, wherein the angle of incidence of the actinic radiation on the patterned surface of the imprint template is greater than 70°.

4. The method of any preceding clause, wherein the actinic radiation is coupled into the imprint template via an actinic radiation receiving face which is not parallel to the patterned surface of the imprint template.

5. The method of any preceding clause, wherein the actinic radiation is coupled into the imprint template via a prism which is in optical communication with the imprint template.

6. The method of any preceding clause, wherein actinic radiation is directed at the imprintable medium from opposite directions.

7. The method of any preceding clause, wherein the actinic radiation is s-polarized.

8. An imprint lithography apparatus comprising an imprint template and an outlet of actinic radiation, wherein the outlet of actinic radiation and the imprint template are configured to deliver actinic radiation which is oriented such that it is not perpendicularly incident upon a patterned surface of the imprint template.

9. The apparatus of clause 8, wherein the angle of incidence of the actinic radiation on the patterned surface of the imprint template is greater than 30°.

10. The apparatus of clause 8 or clause 9, wherein the angle of incidence of the actinic radiation on the patterned surface of the imprint template is greater than 70°.

11. The apparatus of any of clauses 8 to 10, wherein the outlet of actinic radiation is configured to direct actinic radiation towards the imprint template in a direction which is not perpendicular relative to a patterned surface of the imprint template.

12. The apparatus of any of clauses 8 to 11, wherein the imprint template has an actinic radiation receiving face which is not parallel to the patterned surface of the imprint template.

13. The apparatus of any of clauses 8 to 12, wherein the imprint template has an actinic radiation receiving face which is not perpendicular to the patterned surface of the imprint template.

14. The apparatus of any of clauses 8 to 13, further comprising a structure which is in optical communication with the imprint template and which provides an actinic radiation receiving face which is not parallel to the patterned surface of the imprint template.

15. The apparatus of any of clauses 8 to 13, further comprising a structure which is in optical communication with the imprint template and which provides an actinic radiation receiving face which is substantially parallel to the patterned surface of the imprint template.

16. The apparatus of clause 14 or clause 15, wherein the structure is provided with a reflective surface.

17. The apparatus of any of clauses 14 to 16, wherein the structure is a prism.

18. The apparatus of any of clauses 8 to 17, further comprising an actinic radiation source connected to the outlet, the actinic radiation source configured to provide s-polarized actinic radiation.

19. An imprint lithography apparatus comprising an imprint template holder, wherein the imprint template holder comprises a structure which is configured to deliver actinic radiation from a source of actinic radiation into an imprint template such that it is incident upon a patterned surface of the imprint template at a non-perpendicular angle.

20. The apparatus of clause 19, wherein the structure is a prism.

21. An imprint lithography apparatus comprising an outlet of actinic radiation which is configured such that during use it delivers actinic radiation into an imprint template such that it is incident upon a patterned surface of the imprint template at a non-perpendicular angle.

22. An imprint lithography template having an actinic radiation receiving face which is not parallel to a patterned surface of the imprint template.

23. The imprint lithography template of clause 22, wherein the actinic radiation receiving face is not perpendicular to the patterned surface of the imprint template.

The invention claimed is:

1. An imprint lithography method comprising bringing an imprint template, having a surface patterned with a pattern used to form a mask for fabrication of an end-product, into contact with imprintable medium provided on a substrate, and directing actinic radiation, that is actinic for the imprintable medium, at the imprintable medium and the patterned surface, the actinic radiation being oriented such that it is not perpendicularly incident upon the patterned surface of the imprint template.

2. The method of claim 1, wherein the angle of incidence of the actinic radiation on the patterned surface of the imprint template is greater than 30°.

3. The method of claim 1, wherein the angle of incidence of the actinic radiation on the patterned surface of the imprint template is greater than 70°.

4. The method of claim 1, wherein the actinic radiation is coupled into the imprint template via an actinic radiation receiving face which is not parallel to the patterned surface of the imprint template.

5. The method of claim 1, wherein the actinic radiation is coupled into the imprint template via a prism which is in optical communication with the imprint template.

6. The method of claim 1, wherein actinic radiation is directed at the imprintable medium from opposite directions.

7. The method of claim 1, wherein the actinic radiation is s-polarized.

8. The method of claim 1, wherein the directing the actinic radiation further comprises a face of a structure receiving the actinic radiation, the face not being parallel to the patterned surface of the imprint template and the structure being in optical communication with the imprint template.

9. The method of claim 1, wherein the directing the actinic radiation further comprises a face of a structure receiving the actinic radiation, the face being substantially parallel to the patterned surface of the imprint template and the structure being in optical communication with the imprint template.

10. An imprint lithography method comprising:
holding an imprint template, having a surface patterned with a pattern used to form a mask for fabrication of an end-product, with an imprint template holder, the imprint template holder having a structure which is configured to receive actinic radiation, that is actinic for the imprintable medium, from a source of actinic radiation and provide the actinic radiation to the imprint template;
bringing the imprint template into contact with imprintable medium provided on a substrate; and
directing actinic radiation at the imprintable medium and the patterned surface via the structure and the imprint template, the actinic radiation being oriented such that it is not perpendicularly incident upon the patterned surface of the imprint template.

11. The method of claim 10, wherein a face of the structure receiving the actinic radiation is not parallel to the patterned surface of the imprint template.

12. The method of claim 10, wherein the structure comprises a reflective surface to reflect the radiation received by the structure toward the patterned surface of the imprint template.

13. The method of claim 10, wherein the actinic radiation comprises s-polarized radiation.

14. An imprint lithography method comprising:
bringing an imprint template, having a surface patterned with a pattern used to form a mask for fabrication of an end-product, into contact with imprintable medium provided on a substrate; and
directing actinic radiation, that is actinic for the imprintable medium, into an actinic radiation receiving face of the imprint template, which face is not parallel to a patterned surface of the imprint template, and at the imprintable medium and the patterned surface, the actinic radiation being oriented in the imprint template such that it is not perpendicularly incident upon the patterned surface of the imprint template.

15. The method of claim 14, wherein the actinic radiation receiving face is not perpendicular to the patterned surface of the imprint template.

16. The method of claim 14, wherein the angle of incidence of the actinic radiation on the patterned surface of the imprint template is greater than 30°.

17. The method of claim 14, wherein the actinic radiation comprises s-polarized radiation.

18. An imprint lithography method comprising:
bringing an imprint template, having a surface patterned with a pattern used to form a mask for fabrication of an end-product, into contact with imprintable medium provided on a substrate; and
directing actinic radiation, that is actinic for the imprintable medium, into an actinic radiation receiving face, which face is not parallel to a patterned surface of the imprint template and not perpendicular to a patterned surface of the imprint template, and at the imprintable medium and the patterned surface, the actinic radiation being oriented in the imprint template such that it is not perpendicularly incident upon the patterned surface of the imprint template.

19. The method of claim 18, wherein the angle of incidence of the actinic radiation on the patterned surface of the imprint template is greater than 30°.

20. The method of claim 19, wherein the actinic radiation comprises s-polarized radiation.

* * * * *